US012693635B2

(12) United States Patent
Matlak et al.

(10) Patent No.: US 12,693,635 B2
(45) Date of Patent: Jul. 28, 2026

(54) BRIGHT COLOR COATINGS FOR ELECTRONIC DEVICES

(71) Applicant: Apple Inc., Cupertino, CA (US)

(72) Inventors: Jozef M. Matlak, San Francisco, CA (US); Brian S. Tryon, Redwood City, CA (US); Lijie Bao, Saratoga, CA (US); Maruwada Sukanya Sharma, Redwood City, CA (US); Shiva K. Mandepudi, San Ramon, CA (US); Sonja R. Postak, Newark, CA (US)

( * ) Notice: Subject to any disclaimer, the term of this patent is extended or adjusted under 35 U.S.C. 154(b) by 14 days.

(21) Appl. No.: 18/747,167

(22) Filed: Jun. 18, 2024

(65) Prior Publication Data

US 2024/0337986 A1     Oct. 10, 2024

Related U.S. Application Data

(62) Division of application No. 17/406,826, filed on Aug. 19, 2021, now Pat. No. 12,050,436.

(Continued)

(51) Int. Cl.
*G04G 17/08* (2006.01)
*C23C 14/00* (2006.01)
(Continued)

(52) U.S. Cl.
CPC ......... *G04G 17/08* (2013.01); *C23C 14/0015* (2013.01); *C23C 14/025* (2013.01);
(Continued)

(58) Field of Classification Search
None
See application file for complete search history.

(56) References Cited

U.S. PATENT DOCUMENTS 9,212,425 B2    12/2015  Eerden et al.
9,845,535 B2    12/2017  Kim et al.
(Continued)

FOREIGN PATENT DOCUMENTS

CN      109392259 A    2/2019
CN      110876245 A    3/2020
(Continued)

OTHER PUBLICATIONS

Mohammad Sharear Kabir et al., "Structure and mechanical properties of graded Cr/CrN/CrTiN coatings synthesized by close field unbalanced magnetron sputtering", Surface & Coatings Technology, Oct. 30, 2016, vol. 309, pp. 779-789, Elsevier.
(Continued)

*Primary Examiner* — Seth Dumbris
(74) *Attorney, Agent, or Firm* — Treyz Law Group, P.C.; Michael H. Lyons; David K. Cole

(57)     ABSTRACT

An electronic device may include conductive structures such as conductive housing structures. A high-brightness, visible-light-reflecting coating may be formed on the conductive structures. The coating may have adhesion and transition layers and an uppermost coloring layer on the adhesion and transition layers. At least the uppermost coloring layer may be deposited using a high impulse magnetron sputtering (HiPIMS) process. The uppermost coloring layer may include a TiCrN film, a TiCrCN film, a TiCN film, or a metal nitride film that contains Ti, Zr, Hf, or Cr. The coating may exhibit a high-brightness gold color.

18 Claims, 11 Drawing Sheets

Related U.S. Application Data

(60) Provisional application No. 63/073,352, filed on Sep. 1, 2020.

(51) Int. Cl.

| | | |
|---|---|---|
| *C23C 14/02* | (2006.01) | |
| *C23C 14/06* | (2006.01) | |
| *C23C 14/35* | (2006.01) | |
| *C23C 28/00* | (2006.01) | |

(52) U.S. Cl.
CPC ...... *C23C 14/0641* (2013.01); *C23C 14/0664* (2013.01); *C23C 14/35* (2013.01); *C23C 28/34* (2013.01)

(56) References Cited

U.S. PATENT DOCUMENTS

| | | | |
|---|---|---|---|
| 10,030,299 B2 | 7/2018 | Tsukihara et al. | |
| 11,136,672 B2 * | 10/2021 | Tryon ..................... | C23C 28/34 |
| 2002/0017235 A1 | 2/2002 | Nagasaka et al. | |
| 2005/0208325 A1 | 9/2005 | Kawakami et al. | |

| | | | |
|---|---|---|---|
| 2014/0099489 A1 * | 4/2014 | Cha ..................... | C23C 14/0641 |
| | | | 428/446 |
| 2014/0141278 A1 | 5/2014 | Derrig | |
| 2014/0199561 A1 | 7/2014 | Zhang et al. | |
| 2014/0271000 A1 * | 9/2014 | Sakamoto ............ | C23C 30/005 |
| | | | 407/119 |
| 2016/0265098 A1 * | 9/2016 | Tsukihara ........... | C23C 14/0664 |
| 2020/0015390 A1 | 1/2020 | Bayat et al. | |
| 2020/0224318 A1 | 7/2020 | Derrig | |

FOREIGN PATENT DOCUMENTS

| | | | |
|---|---|---|---|
| CN | 111519155 A | | 8/2020 |
| JP | 2005082822 A | | 3/2005 |
| JP | 2008284624 A | * | 11/2008 |

OTHER PUBLICATIONS

Mjayasarathi Prabakaran et al., "Characterisation and Corrosion Resistance of TiCrN Composite Coating on Steel by Physical Vapour Deposition Method", Journal of Bio- and Tribo-Corrosion, Aug. 29, 2016, vol. 2, Issue 25, Springer International Publishing, Switzerland.

* cited by examiner

BRIGHT COLOR COATINGS FOR ELECTRONIC DEVICES

This application is a division of U.S. patent application Ser. No. 17/406,826, filed Aug. 19, 2021, which claims the benefit of U.S. Provisional Patent Application No. 63/073,352, filed Sep. 1, 2020, which are hereby incorporated by reference herein in their entireties.

FIELD

This relates generally to coatings for electronic device structures and, more particularly, to visible-light-reflecting coatings for conductive electronic device structures.

BACKGROUND

Electronic devices such as cellular telephones, computers, watches, and other devices contain conductive structures such as conductive housing structures. The conductive structures are provided with a coating that reflects particular wavelengths of light so that the conductive components exhibit a desired visible color.

It can be challenging to provide coatings such as these with a desired color brightness. In addition, if care is not taken, the coatings may exhibit unsatisfactory optical performance across different operating environments and conductive structure geometries.

SUMMARY

An electronic device may include conductive structures such as conductive housing structures. A high-brightness, visible-light-reflecting coating may be formed on the conductive structures. The coating may have adhesion and transition layers and an uppermost coloring layer on the adhesion and transition layers. At least the uppermost coloring layer may be deposited using a high impulse magnetron sputtering (HiPIMS) process. The uppermost coloring layer may include a TiCrN film, a TiCrCN film, a TiCN film, or a metal nitride film that contains Ti, Zr, Hf, or Cr. The coating may exhibit a high-brightness gold color.

An aspect of the disclosure provides an apparatus. The apparatus can have a conductive substrate. The apparatus can have a coating on the substrate. The coating can have a color. The coating can have adhesion and transition layers. The coating can have an uppermost layer on the adhesion and transition layers. The uppermost layer can include a TiCrN film.

Another aspect of the disclosure provides an apparatus. The apparatus can have a conductive substrate. The apparatus can have a coating on the conductive substrate. The coating can have a color. The coating can have adhesion and transition layers. The coating can have an uppermost layer on the adhesion and transition layers. The uppermost layer can include a TiCrCN film. An atomic percentage of Cr atoms in the TiCrCN film may be greater than 12%.

Yet another aspect of the disclosure provides an apparatus. The apparatus can have a conductive substrate. The apparatus can have a coating on the conductive substrate. The coating can have a color. The coating can have adhesion and transition layers. The coating can have an uppermost layer on the adhesion and transition layers. The uppermost layer can include a TiN film, a TiNSiC film, a ZrN film, a ZrNC film, a ZrNSi film, a ZrNSiC film, a HfN film, a HfNC film, a HfNSi film, a HfNSiC film, a CrN film, or a CrNSi film.

DETAILED DESCRIPTION

Electronic devices and other items may be provided with conductive structures. Coatings may be formed on the conductive structures to reflect particular wavelengths of visible light so that the conductive structures exhibit a desired color. A high-brightness, visible-light-reflecting coating may be deposited on a conductive substrate. The coating may include transition and adhesion layers on the substrate and an uppermost coloring layer on the transition and adhesion layers. The uppermost coloring layer may include a TiCrN film, a TiCrCN film, a TiCN film, or a metal nitride film that contains Ti, Zr, Hf, or Cr. The coating may be deposited using a high impulse magnetron sputtering (HiPIMS) process. The coating may exhibit a bright gold color without using real gold in the uppermost coloring layer.

Figure 1:
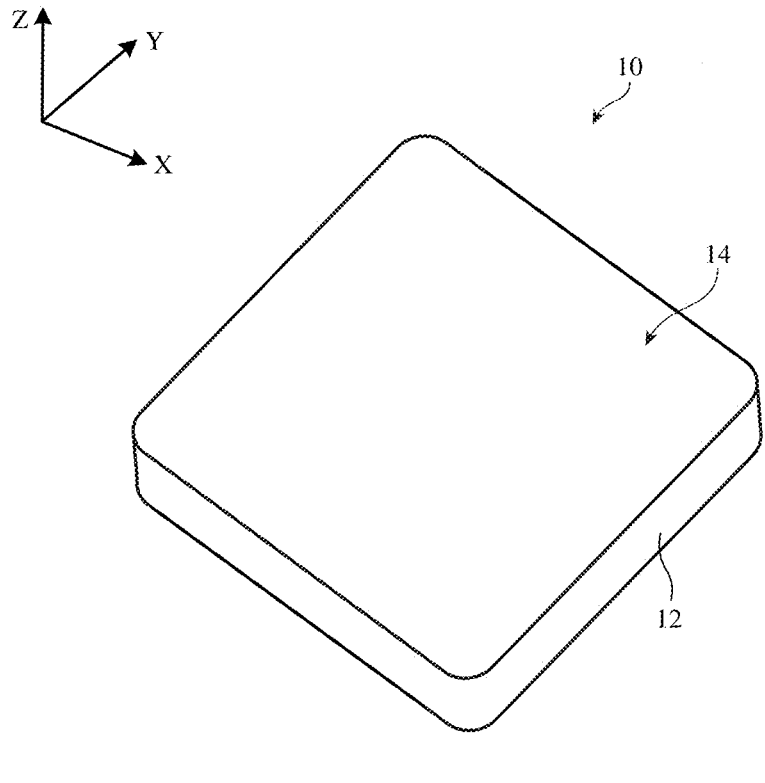
FIG. 1 is a perspective view of an illustrative electronic device of the type that may be provided with conductive structures and high-brightness coatings in accordance with some embodiments.

An illustrative electronic device of the type that may be provided with conductive structures and high-brightness, visible-light-reflecting coatings is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head (e.g., a head mounted device), or other wearable or miniature device, a television, a computer display that does not contain an embedded computer, a gaming device, a navigation device, an embedded system such as a system in which electronic equipment with a display is mounted in a kiosk or automobile, a wireless base station, a home entertainment system, a wireless speaker device, a wireless access point, equipment that implements the functionality of two or more of these devices, or other electronic equipment. In the illustrative configuration of FIG. 1, device 10 is a portable device having a substantially rectangular lateral outline such as a cellular telephone or tablet computer. Other configurations may be used for device 10 if desired. The example of FIG. 1 is merely illustrative.

In the example of FIG. 1, device 10 includes a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewalls or sidewalls formed from other materials. Examples of metal materials that may be used for forming housing 12 include stainless steel, aluminum, silver, gold, titanium, metal alloys, or any other desired conductive material.

Display 14 may be formed at (e.g., mounted on) the front side (face) of device 10. Housing 12 may have a rear housing wall on the rear side (face) of device 10 that opposes the front face of device 10. Conductive housing sidewalls in housing 12 may surround the periphery of device 10. The rear housing wall of housing 12 may be formed from conductive materials and/or dielectric materials.

The rear housing wall of housing 12 and/or display 14 may extend across some or all of the length (e.g., parallel to the X-axis of FIG. 1) and width (e.g., parallel to the Y-axis) of device 10. Conductive sidewalls of housing 12 may extend across some or all of the height of device 10 (e.g., parallel to Z-axis).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode (OLED) display pixels, an array of electrowetting display pixels, or display pixels based on other display technologies.

Display 14 may be protected using a display cover layer. The display cover layer may be formed from a transparent material such as glass, plastic, sapphire or other crystalline dielectric materials, ceramic, or other clear materials. The display cover layer may extend across substantially all of the length and width of device 10, for example.

Device 10 may include one or more buttons. The buttons may be formed from a conductive button member that is located within (e.g., protruding through) openings in housing 12 or openings in display 14 (as examples). Buttons may be rotary buttons, sliding buttons, buttons that are actuated by pressing on a movable button member, etc.

Figure 2:
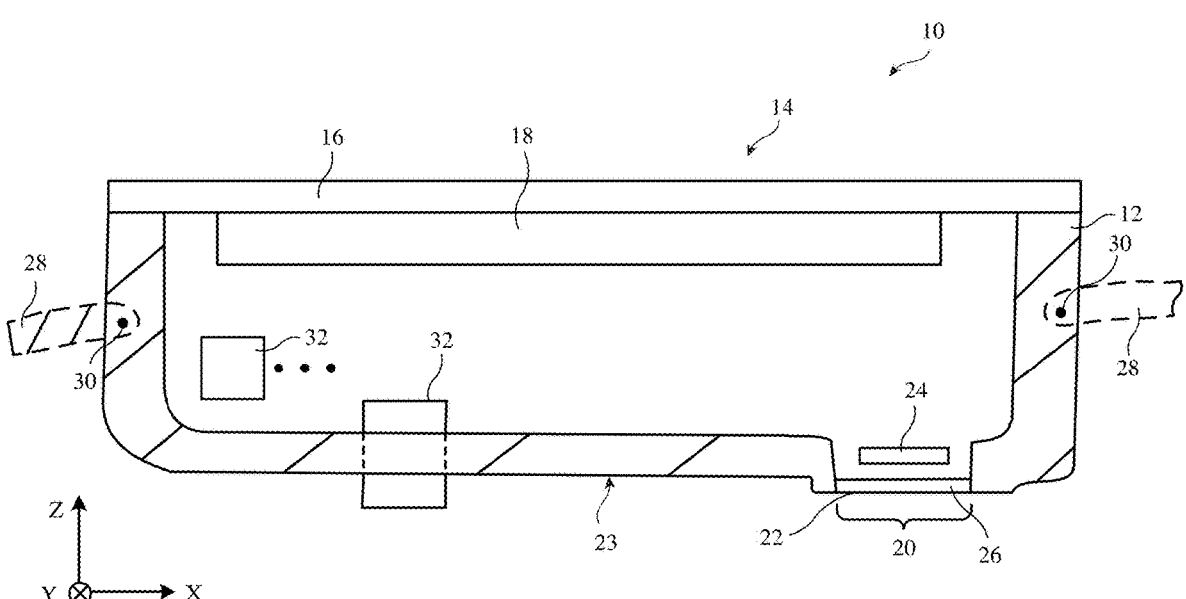
FIG. 2 is cross-sectional side view of an illustrative electronic device having conductive structures that may be provided with high-brightness coatings in accordance with some embodiments.

A cross-sectional side view of device 10 in an illustrative configuration in which display 14 has a display cover layer is shown in FIG. 2. As shown in FIG. 2, display 14 may have one or more display layers that form pixel array 18. During operation, pixel array 18 forms images for a user in an active area of display 14. Display 14 may also have inactive areas (e.g., areas along the border of pixel array 18) that are free of pixels and that do not produce images. Display cover layer 16 of FIG. 2 overlaps pixel array 18 in the active area and overlaps electrical components in device 10.

Display cover layer 16 may be formed from a transparent material such as glass, plastic, ceramic, or crystalline materials such as sapphire. Illustrative configurations in which a display cover layer and other transparent members in device 10 (e.g., windows for cameras and other light-based devices that are formed in openings in housing 12) are formed from a hard transparent crystalline material such as sapphire (sometimes referred to as corundum or crystalline aluminum oxide) may sometimes be described herein as an example. Sapphire makes a satisfactory material for display cover layers and windows due to its hardness (9 Mohs). In general, however, these transparent members may be formed from any suitable material.

Display cover layer 16 for display 14 may be planar or curved and may have a rectangular outline, a circular outline, or outlines of other shapes. If desired, openings may be formed in the display cover layer. For example, an opening may be formed in the display cover layer to accommodate a button, a speaker port, or other component. Openings may be formed in housing 12 to form communications or data ports (e.g., an audio jack port, a digital data port, a port for a subscriber identity module (SIM) card, etc.), to form openings for buttons, or to form audio ports (e.g., openings for speakers and/or microphones).

Device 10 may, if desired, be coupled to a strap such as strap 28 (e.g., in scenarios where device 10 is a wristwatch device). Strap 28 may be used to hold device 10 against a user's wrist (as an example). Strap 28 may sometimes be referred to herein as wrist strap 28. In the example of FIG. 2, wrist strap 28 is connected to attachment structures 30 in housing 12 at opposing sides of device 10. Attachment structures 30 may include lugs, pins, springs, clips, brackets, and/or other attachment mechanisms that configure housing 12 to receive wrist strap 28. Configurations that do not include straps may also be used for device 10.

Figure 3:
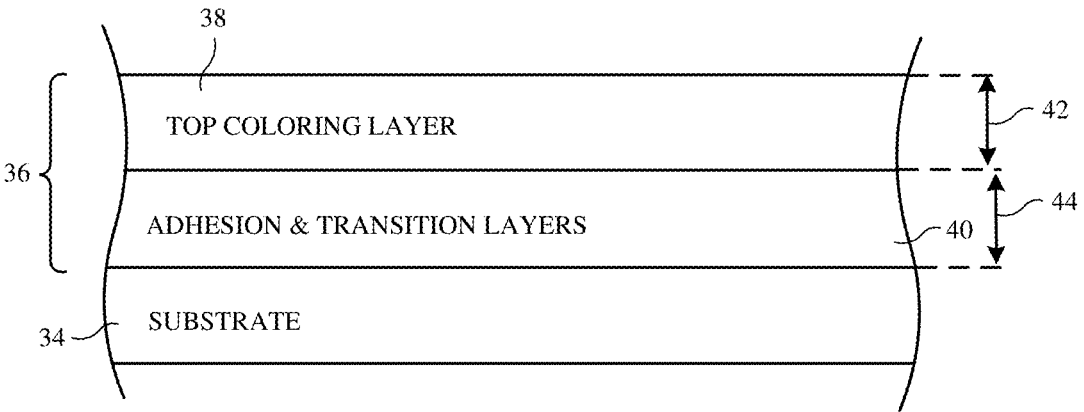
FIG. 3 is a cross-sectional side view of an illustrative high-brightness coating in accordance with some embodiments.

If desired, light-based components such as light-based components 24 may be mounted in alignment with an opening 20 in housing 12. Opening 20 may be circular, may be rectangular, may have an oval shape, may have a triangular shape, may have other shapes with straight and/or curved edges, or may have other suitable shapes (outlines when viewed from above). Window member 26 may be mounted in window opening 20 of housing 12 so that window member 26 overlaps component 18. A gasket, bezel, adhesive, screws, or other fastening mechanisms may be used in attaching window member 26 to housing 12. Surface 22 of window member 26 may lie flush with exterior surface 23 of housing 12, may be recessed below exterior surface 23, or may, as shown in FIG. 3, be proud of exterior surface 23 (e.g., surface 22 may lie in a plane that protrudes away from surface 23 in the −Z direction). In other words, window member 26 may be mounted to a protruding portion of housing 12. Surface 23 may, for example, form the rear face of housing 12.

Conductive structures in device 10 may be provided with a high-brightness, visible-light-reflecting coating that reflects certain wavelengths of light so that the conductive structures exhibit a desired aesthetic appearance (e.g., a desired color, reflectivity, etc.). The conductive structures in device 10 may include, for example, conductive portions of housing 12 (e.g., conductive sidewalls for device 10, a conductive rear wall for device 10, a protruding portion of housing 12 used to mount window member 26, etc.), attachment structures 30, conductive portions of wrist strap 28, a conductive mesh, conductive components 32, and/or any other desired conductive structures on device 10. Conductive components 32 may include internal components (e.g., internal housing members, a conductive frame, a conductive chassis, a conductive support plate, conductive brackets, conductive clips, conductive springs, input-output components or devices, etc.), components that lie both at the interior and exterior of device 10 (e.g., a conductive SIM card tray or SIM card port, a data port, a microphone port, a speaker port, a conductive button member, etc.), or components that are mounted at the exterior of device 10 (e.g., conductive portions of strap 28 such as a clasp for strap 28), and/or any other desired conductive structures on device 10.

FIG. 3 is a cross-sectional diagram of a high-brightness, visible-light-reflecting coating that may be provided on conductive structures in device 10 (e.g., portions of housing 12 of FIGS. 1 and 2, conductive components 32 of FIG. 2, etc.). As shown in FIG. 3, high-brightness, visible-light-reflecting coating 36 may be formed on substrate 34. High-brightness, visible-light-reflecting coating 36 may sometimes be referred to herein as high-brightness coating 36 or simply as coating 36. Substrate 34 may be a conductive structure in device 10 such as a conductive portion of housing 12 (FIGS. 1 and 2) or a conductive component 32 (FIG. 2). Substrate 34 may be thicker than coating 36. The thickness of substrate 34 may be 0.1 mm to 5 mm, more than 0.3 mm, more than 0.5 mm, between 5 mm and 20 mm, less than 5 mm, less than 2 mm, less than 1.5 mm, or less than 1 mm (as examples). Substrate 34 may include stainless steel, aluminum, titanium, or other metals or alloys. In other suitable arrangements, substrate 34 may be an insulating substrate such as a ceramic substrate, a glass substrate, or substrates formed from other materials.

Coating 36 may include adhesion and transition layers 40 on substrate 34 and a top (uppermost) coloring layer (film) 38 on adhesion and transition layers 40. Top coloring layer 38 may, for example, have a first lateral surface that directly contacts adhesion and transition layers 40 and may have a second lateral surface opposite the first lateral surface. Adhesion and transition layers 40 may have thickness 44 (e.g., between 0.1 and 3 microns).

Top coloring layer 38 may, for example, be an intrinsically-colored layer (e.g., a layer that is opaque to visible light) that preferentially absorbs incident light at particular wavelengths to reveal the color of the reflected wavelengths to an observer. The composition of top coloring layer 38 may provide coating 36 with an intrinsic color (e.g., top coloring layer 38 may configure coating 36 to absorb and reflect light at selected wavelengths to impart coating 36 and thus substrate 34 with a desired high-brightness color and reflectivity). In another suitable arrangement, top coloring layer 38 may be a thin film interference filter.

In one suitable arrangement that is sometimes described herein as an example, top coloring layer 38 and coating 36 may have a gold color (e.g., coating 36 may impart a golden color to substrate 34). In some arrangements, coating 36 is deposited on substrate 34 using a magnetron sputtering process. However, in practice, use of a magnetron sputtering process in depositing coating 36 may impose an upper limit on the brightness of the color of the coating (e.g., an L* value in a CIE L*a*b* (CIELAB or Lab) color space). This may cause the coating to have an undesirably dark color.

In some arrangements, the color may be brightened by including the element gold (Au) in the coating or by forming substrate 34 itself from gold metal. However, use of real gold may undesirably increase the cost and weight of device 10 and may cause the substrate to exhibit unreliable variations in structure and optical performance across devices. In order to provide coating 36 with a gold color having maximal brightness without using real gold, at least some of coating 36 may be deposited using a high impulse magnetron sputtering (HiPIMS) process.

The HiPIMS process involves the use of deposition equipment that applies high impulses of energy to sputter material onto substrate 34 (e.g., using a higher energy plasma than other magnetron sputtering processes). The other magnetron sputtering processes (sometimes referred to herein as non-HiPIMS magnetron sputtering processes) may, for example, involve using the deposition equipment to apply a regular series of pulses at a first power level. On the other hand, the HiPIMS process involves using the deposition equipment to apply a series of less-frequent pulses at a second power level that is greater than the first power level (e.g., greater by as much as three orders of magnitude). The HiPIMS process may produce higher ionization, denser microstructure, and finer material grains and thus a smoother surface on coating 36 than the non-HiPIMS magnetron sputtering processes (e.g., the non-HiPIMS magnetron sputtering processes may produce coarser material grains and thus a rougher surface on coating 36 than the HiPIMS process). At the same time, the HiPIMS process may allow coating 36 to exhibit a gold color with greater brightness (e.g., a greater L* value) than the non-HiPIMS magnetron sputtering processes. For example, the HiPIMS process may configure the coating to exhibit an L* value that is as much as 1.0-15.0 greater than the L* value that would be produced by the non-HiPIMS magnetron sputtering processes.

In one suitable arrangement that is described herein as an example, the entirety of coating 36 (e.g., adhesion and transition layers 40 and top coloring layer 38) may be deposited on substrate 34 using the HiPIMS process. In some cases, because the HiPIMS process involves very high power, using the HiPIMS process to deposit all of coating 36 may produce undesirable artifacts in the coating due to electric arcing during deposition. In another suitable arrangement, in order to mitigate the risks of arcing, the HiPIMS process may be used to deposit top coloring layer 38 onto adhesion and transition layers 40 after adhesion and transition layers 40 have already been deposited onto substrate 34 using a non-HiPIMS magnetron sputtering process. This may serve to minimize the production of visible artifacts produced by arcing during the deposition of coating 36 and may, for example, reduce cycle time for the deposition. This example is merely illustrative and, if desired, the layers of coating 36 may be deposited using any desired combination of deposition techniques (e.g., physical vapor deposition such as evaporation and/or sputtering, cathodic arc deposition, chemical vapor deposition, ion plating, laser ablation, etc.).

Figure 4:
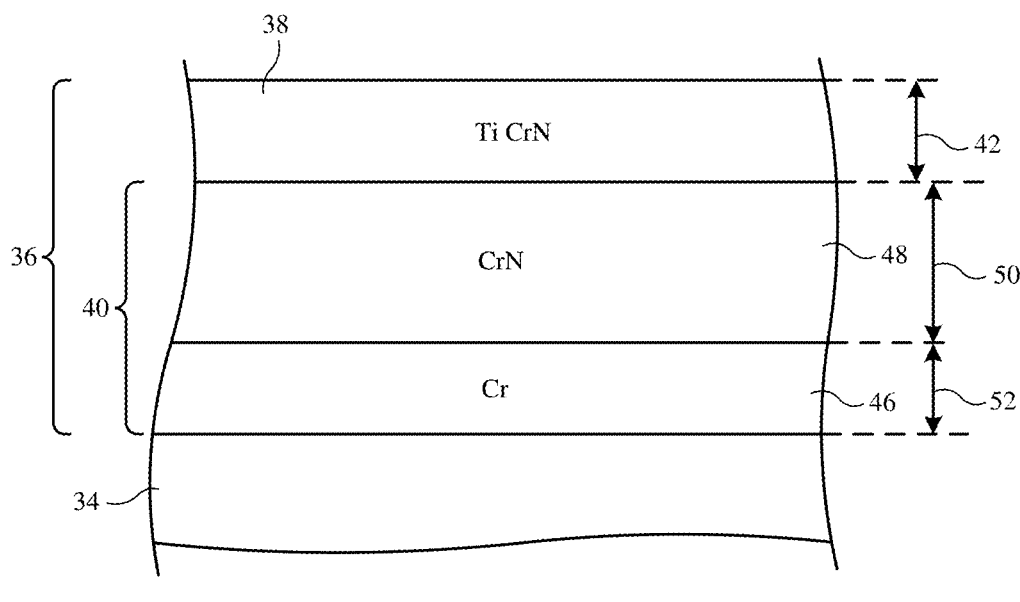
FIG. 4 is a cross-sectional side view of an illustrative high-brightness coating having a TiCrN top coloring layer in accordance with some embodiments.

FIG. 4 is a cross-sectional side view showing one illustrative composition for coating 36 (e.g., to provide coating 36 with a gold color with sufficient brightness without using real gold). As shown in FIG. 4, coating 36 may be layered on substrate 34. Adhesion and transition layers 40 may be deposited on substrate 34 using a non-HiPIMS magnetron sputtering process or, optionally, using the HiPIMS process. Top coloring layer (film) 38 may be deposited on adhesion and transition layers 40 using the HiPIMS process.

As shown in FIG. 4, adhesion and transition layers 40 may include a seed (adhesion) layer such as seed layer 46 on substrate 34 and one or more transition layers such as transition layer 48 on seed layer 46. Seed layer 46 may couple substrate 34 to transition layer 48. In the example of FIG. 4, seed layer 46 is formed from chromium (Cr) and transition layer 48 is formed from chromium nitride (CrN). This is merely illustrative. If desired, seed layer 46 may include chromium silicon (CrSi), titanium (Ti), other metals, metal alloys, and/or other materials. If desired, transition layer 48 may include CrN, chromium silicon nitride (CrSiN), chromium silicon carbonitride (CrSiCN), chromium silicon carbide (CrSiC), chromium carbonitride (CrCN), and/or other materials. Coating 36 may include multiple stacked transition layers 48 if desired.

Transition layer 48 may have thickness 50. Thickness 50 may be, for example, 1.0 micron, 1.1 microns, 1.2 microns, 0.7 microns, 0.6 microns, between 0.7 and 1.1 microns, or any other desired thickness. Seed layer 46 may have thickness 52. Thickness 52 may be, for example, 0.1 microns, 0.2 microns, 0.3 microns, between 0.1 and 0.3 microns, or any other desired thickness.

Coating 36 may include top coloring layer 38 layered on transition layer 48. In the example of FIG. 4, top coloring layer 38 includes titanium chromium nitride (TiCrN) (e.g., top coloring layer 38 may be a TiCrN film on transition layer 48). Top coloring layer 38 may have thickness 42. Thickness 42 may be 0.3 microns, 0.4 microns, 0.5 microns, 0.2 microns, between 0.3 and 0.5 microns, greater than 0.3 microns, less than 0.6 microns, between 0.1 and 1.0 microns, or any other desired thickness.

When configured in this way, top coloring layer 38 may configure coating 36 to exhibit an a* value between 0 and 1, between 0 and 3, between 0 and 5, between 0.5 and 1.5, between 0.5 and 1, or another a* value in the CIELAB color space. Top coloring layer 38 may also configure coating 36 to exhibit a b* value between 10 and 15, between 14 and 15, between 13 and 16, greater than 10, greater than 12, less than 16, between 13 and 15.5, between 14.5 and 15, or another b* value in the CIELAB color space. Top coloring layer 38 may configure coating 36 to exhibit an L* value that is greater than would be obtained by a non-HiPIMS process. For example, top coloring layer 38 may configure coating 36 to exhibit an L* value that is greater than 70, greater than 72, greater than 75, greater than 76, between 70 and 80, between 72 and 80, between 72 and 78, between 75 and 78, between 76 and 80, or another L* value in the CIELAB color space. In other words, top coloring layer 38 may configure coating 36 to exhibit a high-brightness gold color without the use of real gold.

Figure 5:
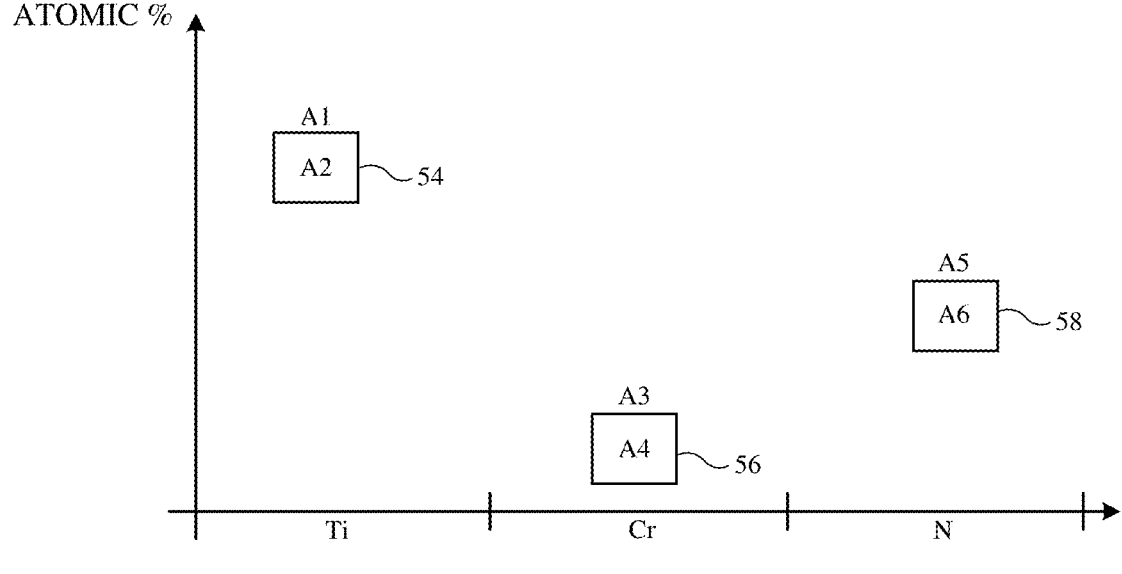
FIG. 5 is a plot of the atomic percentage of different elements in an illustrative TiCrN top coloring layer for a high-brightness coating of the type shown in FIG. 4 in accordance with some embodiments.

FIG. 5 is a plot of illustrative atomic percentages for the different elements in top coloring layer 38 in examples where top coloring layer 38 is a TiCrN layer (e.g., in the configuration of coating 36 as shown in FIG. 4, such as a configuration in which coating 36 is configured to exhibit a high-brightness gold color).

As shown in FIG. 5, the composition of top coloring layer 38 may be selected such that the atomic percentage of titanium (Ti) atoms in top coloring layer 38 lies within region 54 (e.g., a region extending between upper limit A1 and lower limit A2). The atomic percentage of chromium (Cr) atoms in top coloring layer 38 lies within region 56 (e.g., a region extending between upper limit A3 and lower limit A4). The atomic percentage of nitrogen (N) atoms in top coloring layer 38 lies within region 58 (e.g., a region extending between upper limit A5 and lower limit A6).

In the example of FIG. 5, atomic percentage A2 is greater than atomic percentage A5 and atomic percentage A6 is greater than atomic percentage A3. This is merely illustrative and, in general, these percentages may have other relative magnitudes. Regions 54, 56, and 58 may have other relative positions along the vertical axis of FIG. 5 and may have other relative sizes (e.g., where the size of each region is determined by the difference between its corresponding upper and lower limits).

In one suitable arrangement that is sometimes described herein as an example, the upper limit A1 of region 54 (e.g., the upper limit on the atomic percentage of Ti atoms in top coloring layer 38) may be between 50% and 60%, between 54% and 56%, between 51% and 57%, between 45% and 51%, greater than 50%, greater than 55%, less than 60%, 60%, or other values. The lower limit A2 of region 54 (e.g., the lower limit on the atomic percentage of Ti atoms in top coloring layer 48) may be between 50% and 55%, between 50% and 52%, between 48% and 52%, between 45% and 55%, less than 55%, less than 52%, greater than 45%, 45%, greater than 50%, or other values less than upper limit A1.

The upper limit A3 of region 56 (e.g., the upper limit on the atomic percentage of Cr atoms in layer 38) may be between 10% and 20%, between 11% and 15%, between 13% and 15%, between 12% and 22%, greater than 13%, greater than 12%, greater than 10%, 20%, less than 20%, less than 15%, or other values that are less than lower limit A2 of region 54. The lower limit A4 of region 56 (e.g., the lower limit on the atomic percentage of Cr atoms in layer 38) may be between 5% and 14%, between 8% and 12%, between 9% and 11%, between 5% and 11%, less than 15%, less than 12%, less than 11%, greater than 5%, greater than 8%, 12% (e.g., layer 38 may have an atomic percentage of Cr that is greater than or equal to 12%), or other values less than upper limit A3.

The limits of region 58 may be defined by the balance of atomic percentage remaining in layer 38. For example, the upper limit A5 of region 58 (e.g., the upper limit on the atomic percentage of N atoms in layer 38) may be between 30% and 40%, between 35% and 45%, between 36% and 41%, between 35% and 39%, greater than 30%, greater than 35%, less than 40%, less than 42%, less than 45%, or other values less than lower limit A2 of region 54. The lower limit A6 of region 58 (e.g., the lower limit on the atomic percentage of N atoms in layer 38) may be between 30% and 40%, between 30% and 35%, between 25% and 34%, greater than 30%, greater than 25%, less than 35%, less than 33%, or other values less than upper limit A5. The atomic percentage of Cr atoms in transition layer 48 of FIG. 4 may, for example, be between 90% and 95%, between 85% and 95%, less than 96%, greater than 90%, greater than 85%, or other values. The balance of the atomic percentage of transition layer 48 may be filled by the N atoms in transition layer 48. These examples are merely illustrative and, in general, other atomic percentages of these elements may be used (e.g., regions 54, 56, and 58 may have other heights, relative positions, and/or relative sizes).

The example of FIGS. 4 and 5 in which top coloring layer 38 is a TiCrN layer is merely illustrative. In another suitable arrangement, top coloring layer 38 may be a titanium chromium carbonitride (TiCrCN) layer (e.g., a TiCrCN film deposited using the HiPIMS process), as shown in the cross-sectional side view of FIG. 6. The example of FIG. 6 in which transition layer 48 is a CrN layer and seed layer 46 is a Cr layer is merely illustrative. If desired, seed layer 46 may include CrSi, Ti, other metals, metal alloys, and/or other materials. If desired, transition layer 48 may include CrSiN, CrSiCN, CrSiC, CrCN, and/or other materials. Coating 36 of FIG. 6 may include multiple stacked transition layers 48 if desired.

When configured in this way, top coloring layer 38 may configure coating 36 to exhibit an a* value between 1 and 2, between 0 and 3, between 0 and 5, between 1.5 and 2, between 1 and 3, or another a* value in the CIELAB color space. Top coloring layer 38 may also configure coating 36 to exhibit a b* value between 11 and 16, between 14 and 17, between 13 and 18, greater than 15, between 10 and 20, greater than 14, less than 16, between 13 and 15.8, between 14.5 and 15.9, or another b* value in the CIELAB color space. Top coloring layer 38 may configure coating 36 to exhibit an L* value that is greater than would be obtained by a non-HiPIMS process. For example, top coloring layer 38 may configure coating 36 to exhibit an L* value that is greater than 70, greater than 72, greater than 75, between 70 and 80, between 72 and 80, between 72 and 76, between 74 and 77, between 73 and 80, or another L* value in the CIELAB color space. The L* value of coating 36 of FIG. 6 may be less than the L* value of coating 36 of FIG. 4, the a* value of coating 36 of FIG. 6 may be greater than the a* value of coating 36 of FIG. 4, and the b* value of coating 36 of FIG. 6 may be greater than the b* value of coating 36 of FIG. 4, as an example. In other words, top coloring layer 38 may configure coating 68 to exhibit a high-brightness gold color (e.g., with a slightly different hue than is produced by coating 36 of FIG. 4).

Figure 6:
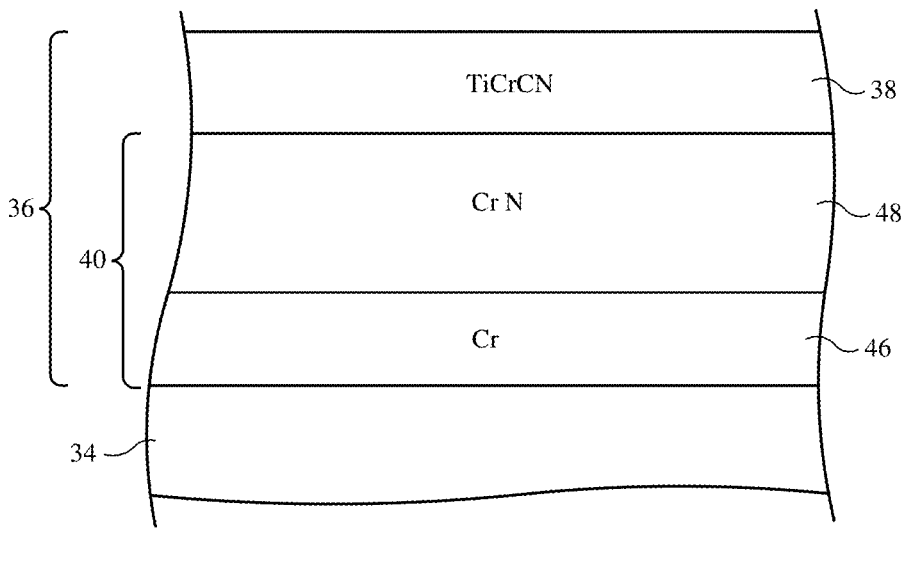
FIG. 6 is a cross-sectional side view of an illustrative high-brightness coating having a TiCrCN top coloring layer in accordance with some embodiments.
Figure 7:
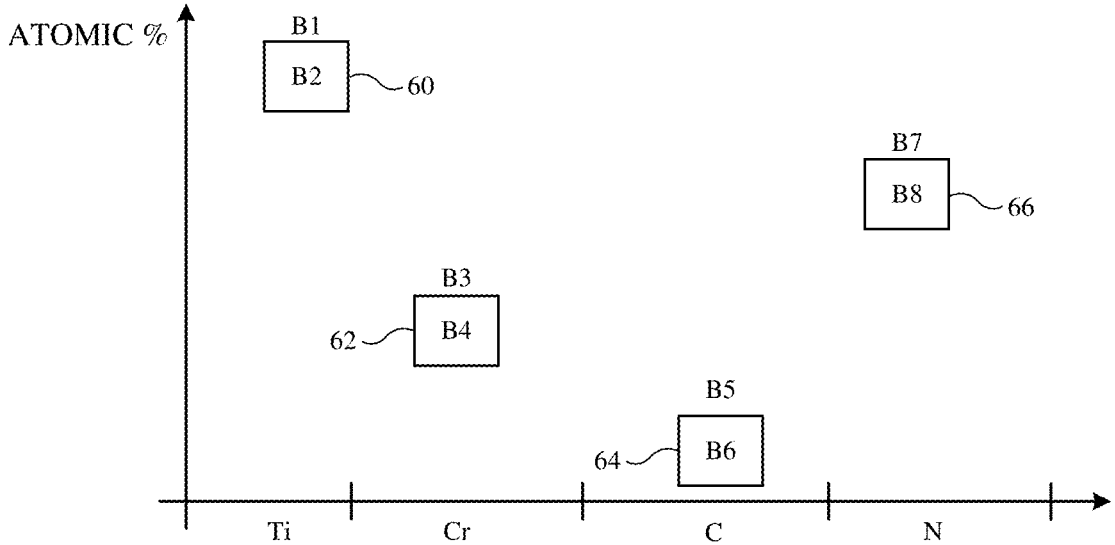
FIG. 7 is a plot of the atomic percentage of different elements in an illustrative TiCrCN top coloring layer for a high-brightness coating of the type shown in FIG. 6 in accordance with some embodiments.

FIG. 7 is a plot of illustrative atomic percentages for the different elements in top coloring layer 38 in examples where top coloring layer 38 is a TiCrCN layer (e.g., in the configuration of coating 36 as shown in FIG. 6, such as a configuration in which coating 36 is configured to exhibit a high-brightness gold color).

As shown in FIG. 7, the composition of top coloring layer 38 may be selected such that the atomic percentage of Ti atoms in top coloring layer 38 lies within region 60 (e.g., a region extending between upper limit B1 and lower limit B2). The atomic percentage of Cr atoms in top coloring layer 38 lies within region 62 (e.g., a region extending between upper limit B3 and lower limit B4). The atomic percentage of carbon (C) atoms in top coloring layer 38 lies within region 64 (e.g., a region extending between upper limit B5 and lower limit B6). The atomic percentage of N atoms in top coloring layer 38 lies within region 66 (e.g., a region extending between upper limit B7 and lower limit B8).

In the example of FIG. 7, atomic percentage B2 is greater than atomic percentage B7, atomic percentage B8 is greater than atomic percentage B3, and atomic percentage B4 is greater than atomic percentage B5. This is merely illustrative and, in general, these percentages may have other relative magnitudes. Regions 60, 62, 64, and 66 may have other relative positions along the vertical axis of FIG. 7 and may have other relative sizes (e.g., where the size of each region is determined by the difference between its corresponding upper and lower limits).

In one suitable arrangement that is sometimes described herein as an example, the upper limit B1 of region 60 (e.g., the upper limit on the atomic percentage of Ti atoms in layer 38) may be between 50% and 60%, between 54% and 56%, between 51% and 57%, between 45% and 60%, greater than 50%, greater than 52%, less than 60%, or other values. The lower limit B2 of region 60 (e.g., the lower limit on the atomic percentage of Ti atoms in layer 48) may be between 40% and 50%, between 44% and 46%, between 44% and 52%, between 41% and 49%, less than 50%, less than 48%, greater than 42%, greater than 40%, or other values less than upper limit B1.

The upper limit B3 of region 62 (e.g., the upper limit on the atomic percentage of Cr atoms in layer 38) may be between 10% and 20%, between 12% and 19%, between 16% and 19%, between 12% and 22%, greater than 15%, greater than 16%, greater than 10%, less than 20%, less than 19%, or other values that are less than lower limit B8 of region 66. The lower limit B4 of region 62 (e.g., the lower limit on the atomic percentage of Cr atoms in layer 38) may be between 10% and 15%, between 8% and 14%, between 12% and 14%, between 5% and 15%, less than 15%, less than 14%, greater than 10%, greater than 12%, or other values less than upper limit B3.

The upper limit B7 of region 66 (e.g., the upper limit on the atomic percentage of N atoms in layer 38) may be between 30% and 40%, between 34% and 36%, between 31% and 41%, between 29% and 42%, greater than 30%, greater than 34%, less than 36%, less than 40%, or other values that are less than lower limit B2 of region 60. The lower limit B8 of region 66 (e.g., the lower limit on the atomic percentage of N atoms in layer 38) may be between 28% and 32%, between 25% and 35%, between 29% and 31%, less than 35%, less than 32%, greater than 25%, greater than 28%, or other values less than upper limit B7.

The limits of region 64 may be defined by the balance of atomic percentage remaining in layer 38. For example, the upper limit B5 of region 64 (e.g., the upper limit on the atomic percentage of C atoms in layer 38) may be between 10% and 15%, between 11% and 13%, between 8% and 15%, greater than 5%, greater than 10%, less than 15%, less than 13%, less than 10%, or other values less than lower limit B4 of region 62. The lower limit B6 of region 64 (e.g., the lower limit on the atomic percentage of C atoms in layer 38) may be greater than 1%, less than 10%, less than 5%, less than 12%, or other values less than upper limit B5. The atomic percentage of Cr atoms in transition layer 48 of FIG. 6 may, for example, be between 75% and 95%, between 85% and 95%, less than 96%, greater than 80%, or other values. The balance of the atomic percentage of transition layer 48 may be filled by the N atoms in transition layer 48. These examples are merely illustrative and, in general, other atomic percentages of these elements may be used (e.g., regions 60, 62, 64, and 66 may have other heights, relative positions, and/or relative sizes).

Figure 8:
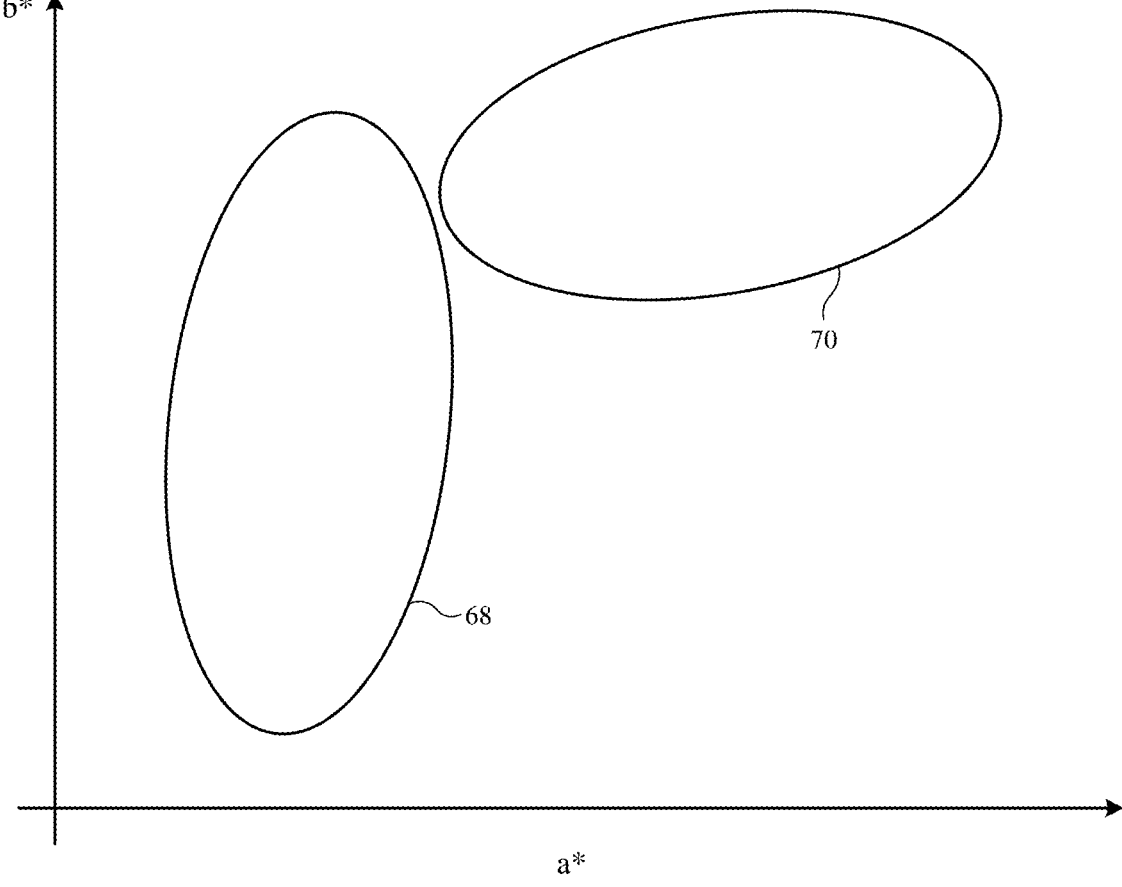
FIG. 8 is a plot of a*b* color space for illustrative high-brightness coatings of the types shown in FIGS. 4-7 in accordance with some embodiments.

The arrangement of FIGS. 4 and 5 and the arrangement of FIGS. 6 and 7 may respectively configure coating 36 to exhibit slightly different high-brightness gold colors. FIG. 8 is an exemplary plot of CIE a*b* color space for the visible light that is reflected by coating 36 (e.g., where a* values are plotted on the horizontal axis and b* values are plotted on the vertical axis). As shown in FIG. 8, region 68 represents an exemplary color profile of coating 36 when provided with a TiCrN top coloring layer 38 (FIGS. 4 and 5). Region 70 represents an exemplary color profile of coating 36 when provided with a TiCrCN top coloring layer 38 (FIGS. 6 and 7). As shown by regions 68 and 70, using TiCrCN to form top coloring layer 38 may provide coating 36 with a greater a* value and likely a greater b* value than using TiCrN to form top coloring layer 38. The example of FIG. 8 is merely illustrative. In general, regions 68 and 70 may have other shapes, sizes, or relative positions. While regions 68 and 70 are shown as non-overlapping in FIG. 8 for the sake of clarity, in practice, regions 68 and 70 may be at least partially overlapping.

The examples of FIGS. 4-8 in which top coloring layer 38 is a TiCrN layer or a TiCrCN layer is merely illustrative. In another suitable arrangement, top coloring layer 38 may be a titanium carbonitride (TiCN) layer (e.g., a TiCN film deposited using the HiPIMS process), as shown in the cross-sectional side view of FIG. 9.

Figure 9:
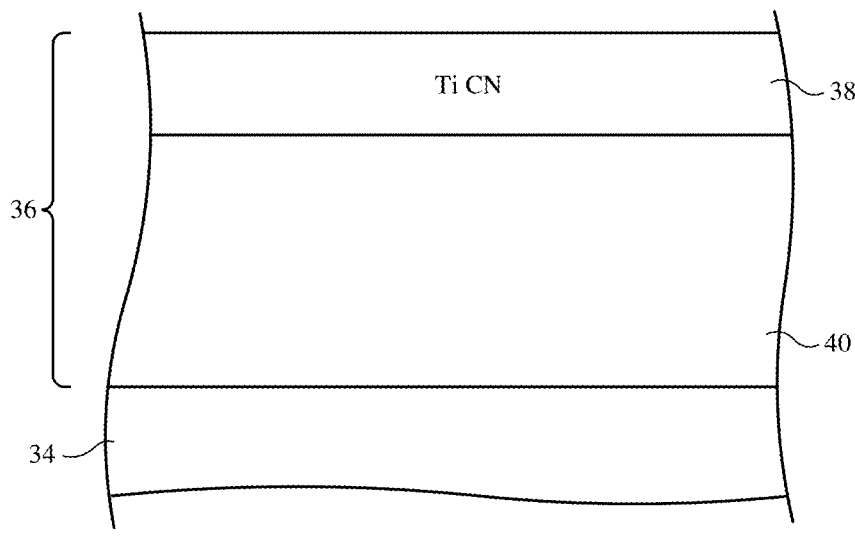
FIG. 9 is a cross-sectional side view of an illustrative high-brightness coating having a TiCN top coloring layer in accordance with some embodiments.
Figure 10:
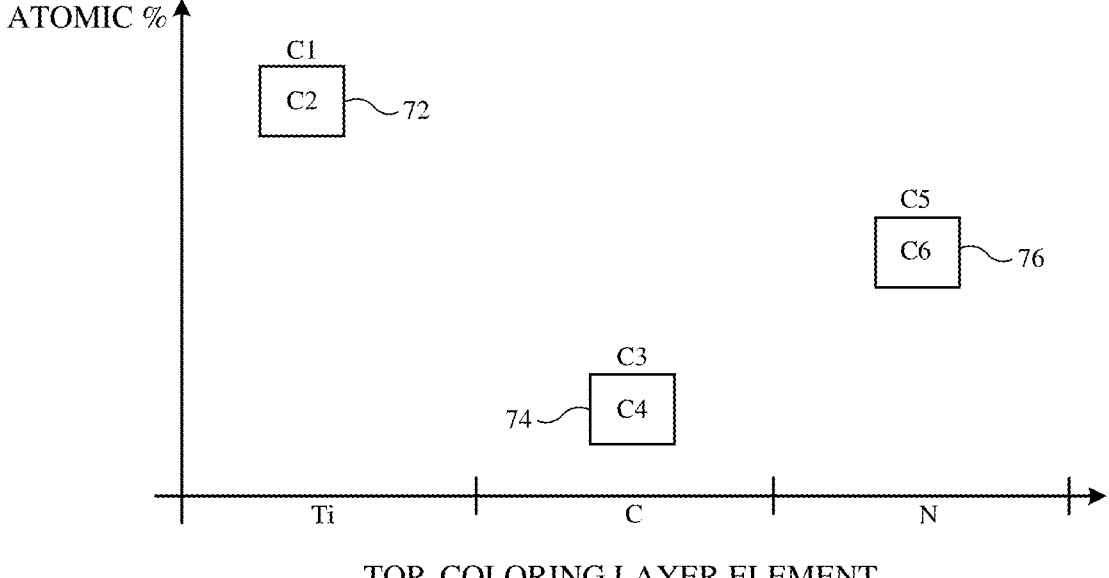
FIG. 10 is a plot of the atomic percentage of different elements in an illustrative TiCN top coloring layer for a high-brightness coating of the type shown in FIG. 9 in accordance with some embodiments.

FIG. 10 is a plot of illustrative atomic percentages for the different elements in top coloring layer 38 in examples where top coloring layer 38 is a TiCN layer (e.g., in the configuration of coating 36 as shown in FIG. 9, such as a configuration in which coating 36 is configured to exhibit a high-brightness gold color).

As shown in FIG. 10, the composition of top coloring layer 38 may be selected such that the atomic percentage of Ti atoms in top coloring layer 38 lies within region 72 (e.g., a region extending between upper limit C1 and lower limit C2). The atomic percentage of C atoms in top coloring layer 38 lies within region 74 (e.g., a region extending between upper limit C3 and lower limit C4). The atomic percentage of N atoms in top coloring layer 38 lies within region 76 (e.g., a region extending between upper limit C5 and lower limit C6).

In the example of FIG. 7, atomic percentage C2 is greater than atomic percentage C5 and atomic percentage C6 is greater than atomic percentage C3. This is merely illustrative and, in general, these percentages may have other relative magnitudes. Regions 72, 74, and 76 may have other relative positions along the vertical axis of FIG. 10 and may have other relative sizes (e.g., where the size of each region is determined by the difference between its corresponding upper and lower limits).

In one suitable arrangement that is sometimes described herein as an example, the upper limit C1 of region 72 (e.g., the upper limit on the atomic percentage of Ti atoms in layer 38) may be between 50% and 60%, between 50% and 55%, between 53% and 55%, between 45% and 60%, greater than 50%, greater than 53%, less than 55%, less than 60%, or other values. The lower limit C2 of region 72 (e.g., the lower limit on the atomic percentage of Ti atoms in layer 48) may be between 40% and 55%, between 48% and 52%, between 50% and 52%, less than 55%, less than 52%, greater than 45%, greater than 50%, or other values less than upper limit C1.

The upper limit C5 of region 76 (e.g., the upper limit on the atomic percentage of N atoms in layer 38) may be between 30% and 45%, between 40% and 45%, between 42% and 44%, between 35% and 50%, greater than 40%, greater than 42%, less than 45%, less than 50%, or other values that are less than lower limit C2 of region 72. The lower limit C6 of region 76 (e.g., the lower limit on the atomic percentage of N atoms in layer 38) may be between 30% and 40%, between 35% and 45%, between 32% and 50%, less than 40%, less than 39%, greater than 35%, greater than 30%, or other values less than upper limit C5.

The limits of region 74 may be defined by the balance of atomic percentage remaining in layer 38. For example, the upper limit C3 of region 74 (e.g., the upper limit on the atomic percentage of C atoms in layer 38) may be between 10% and 15%, between 10% and 12%, between 8% and 15%, greater than 5%, greater than 10%, less than 15%, less than 13%, or other values less than lower limit C6 of region 76. The lower limit C4 of region 74 (e.g., the lower limit on the atomic percentage of C atoms in layer 38) may be greater than 1%, greater than 2%, between 1% and 5%, less than 10%, less than 5%, or other values less than upper limit C3. These examples are merely illustrative and, in general, other atomic percentages of these elements may be used (e.g., regions 72, 74, and 76 may have other heights, relative positions, and/or relative sizes).

Figure 11:
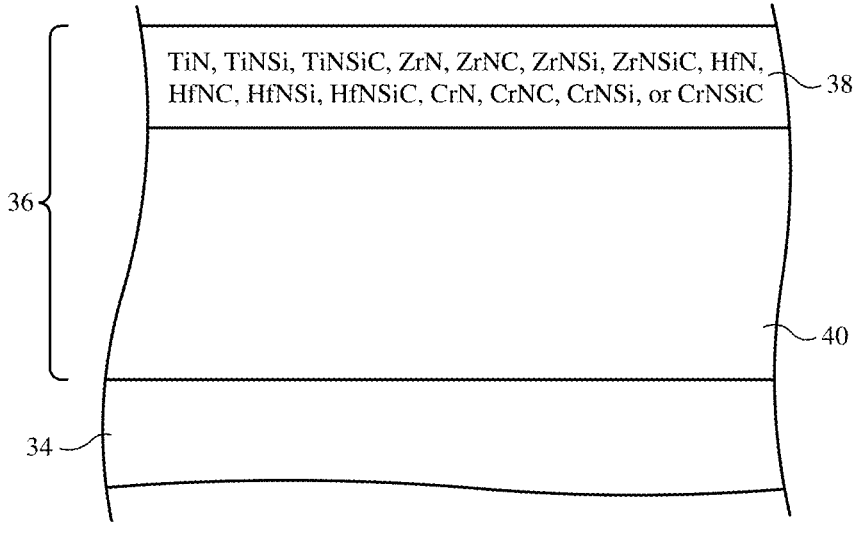
FIG. 11 is a cross-sectional side view of an illustrative high-brightness coating having a metal nitride top coloring layer that contains Ti, Zr, Hf, or Cr in accordance with some embodiments.

The examples of FIGS. 4-10 in which top coloring layer 38 is a TiCrN layer, a TiCrCN, or a TiCN layer is merely illustrative. In another suitable arrangement, top coloring layer 38 may be metal nitride layer that contains Ti, Zr, Hf, or Cr, as shown in the cross-sectional side view of FIG. 11. As shown in FIG. 11, top coloring layer 38 may, if desired, be a titanium nitride (TiN) layer, a titanium nitrogen silicon (TiNSi) layer, a titanium nitrogen silicon carbide (TiNSiC) layer, a zirconium nitride (ZrN) layer, a zirconium nitrogen carbide (ZrNC) layer, a zirconium nitrogen silicon (ZrNSi) layer, a zirconium nitrogen silicon carbide (ZrNSiC) layer, a hafnium nitride (HfN) layer, a hafnium nitrogen carbide (HfNC) layer, a hafnium nitrogen silicon (HfNSi) layer, a hafnium nitrogen silicon carbide (HfNSiC) layer, a chromium nitride layer (CrN), a chromium nitrogen carbide (CrNC) layer, a chromium nitrogen silicon (CrNSi) layer, or a chromium nitrogen silicon carbide (CrNSiC) layer, as examples. When provided with a top coloring layer 38 of the types shown in FIGS. 4-11, coating 36 may have a high brightness gold color that exhibits a desired color response over a variety of operating environments and underlying substrate geometries.

The foregoing is merely illustrative and various modifications can be made to the described embodiments. The foregoing embodiments may be implemented individually or in any combination.

What is claimed is:

1. A cellular telephone comprising:
   a conductive substrate comprising a conductive housing wall; and
   a coating on the conductive housing wall and having a color, the coating comprising:
   adhesion and transition layers, and
   an uppermost layer on the adhesion and transition layers, wherein the uppermost layer comprises a TiCrCN film and wherein an atomic percentage of Cr atoms in the TiCrCN film is greater than or equal to 12%.

2. The cellular telephone of claim 1, wherein the coating has an L* value greater than 70 in a CIELAB color space, an a* value between 0 and 5 in the CIELAB color space, and a b* value between 10 and 20 in the CIELAB color space.

3. The cellular telephone of claim 2, wherein the atomic percentage of Cr atoms in the TiCrCN film is less than 20%.

4. The cellular telephone of claim 3, wherein an atomic percentage of Ti atoms in the TiCrCN film is less than 60%.

5. The cellular telephone of claim 4, wherein the TiCrCN film is deposited on the adhesion and transition layers using a high impulse magnetron sputtering (HiPIMS) process.

6. Apparatus comprising:
   a substrate; and
   a coating on the substrate, the coating comprising:
   adhesion and transition layers, wherein the adhesion and transition layers comprise a Cr seed layer on the substrate and a CrSiN transition layer on the Cr seed layer, and
   an uppermost layer on the adhesion and transition layers, the uppermost layer comprising a TiCrCN film, wherein the TiCrCN film is on the CrSiN transition layer, and wherein the coating has an L* value greater than 70 in a CIELAB color space, an a* value between 0 and 5 in the CIELAB color space, and a b* value between 10 and 15 in the CIELAB color space.

7. The apparatus of claim 6, wherein the TiCrCN film is opaque.

8. The apparatus of claim 6, wherein the TiCrCN film has a thickness between 0.1 and 1.0 microns.

9. The apparatus of claim 8, wherein an atomic percentage of Cr atoms in the TiCrCN film is greater than 5% and less than 20%.

10. The apparatus of claim 9, wherein an atomic percentage of N atoms in the TiCrCN film is between 25% and 42%.

11. The apparatus of claim 6, wherein an atomic percentage of Cr atoms in the TiCrCN film is greater than 5% and less than 20%.

12. The apparatus of claim 11, wherein an atomic percentage of N atoms in the TiCrCN film is greater than 25% and less than 40%.

13. The apparatus of claim 12, wherein an atomic percentage of C atoms in the TiCrCN film is greater than 1% and less than 15%.

14. The apparatus of claim 6, wherein the apparatus comprises a wristwatch and the substrate comprises a conductive housing wall of the wristwatch.

15. The apparatus of claim 6, wherein the TiCrCN film is deposited on the adhesion and transition layers using a high impulse magnetron sputtering (HiPIMS) process.

16. The apparatus of claim 15, wherein the adhesion and transition layers are deposited on the substrate using a non-HiPIMS magnetron sputtering process.

17. An electronic device, comprising:

a structure; and a coating on the structure, the coating comprising:

adhesion and transition layers, wherein the adhesion and transition layers comprise a Cr layer on the structure and a CrSiN layer on the Cr layer, and a TiCrCN layer on the adhesion and transition layers, wherein the TiCrCN layer is an outermost layer of the coating.

18. The electronic device of claim 17, wherein the coating has an L* value greater than 70 in a CIELAB color space, an a* value between 0 and 5 in the CIELAB color space, and a b* value between 10 and 15 in the CIELAB color space, and the structure comprises a conductive housing wall.

* * * * *